(12) United States Patent
Steeman et al.

(10) Patent No.: US 9,676,899 B2
(45) Date of Patent: Jun. 13, 2017

(54) RADIATION CURABLE RESIN COMPOSITION AND RAPID THREE DIMENSIONAL IMAGING PROCESS USING THE SAME

(75) Inventors: Paulus Antonius Maria Steeman, JC Spaubeek (NL); Beert Jacobus Keestra, HG Waalre (NL); Marco Marcus Matheus Driessen, LH Maasbracht (NL); Debra Lynn Fish Repko, Bear, DE (US); Melvin Zussman, Wilmington, DE (US)

(73) Assignee: DSM IP ASSETS B.V., TE Heerlen (NL)

( * ) Notice: Subject to any disclaimer, the term of this patent is extended or adjusted under 35 U.S.C. 154(b) by 1137 days.

(21) Appl. No.: 12/667,108

(22) PCT Filed: Apr. 26, 2007

(86) PCT No.: PCT/EP2007/003676
§ 371 (c)(1),
(2), (4) Date: Aug. 12, 2010

(87) PCT Pub. No.: WO2007/124911
PCT Pub. Date: Nov. 8, 2007

(65) Prior Publication Data
US 2010/0304088 A1    Dec. 2, 2010

Related U.S. Application Data

(60) Provisional application No. 60/796,197, filed on May 1, 2006, provisional application No. 60/907,002, filed on Mar. 16, 2007.

(51) Int. Cl.
*G03F 7/00*    (2006.01)
*G03F 7/038*   (2006.01)
*C08G 59/68*   (2006.01)

(52) U.S. Cl.
CPC ........... *C08G 59/68* (2013.01); *G03F 7/0037* (2013.01); *G03F 7/038* (2013.01); *Y10T 428/24479* (2015.01)

(58) Field of Classification Search
CPC . C08L 63/00; C08F 2/50; C08G 59/68; G03F 7/038; G03F 7/0037; Y10T 428/24479
USPC .......................... 428/156; 264/401; 522/170
See application file for complete search history.

(56) References Cited

U.S. PATENT DOCUMENTS

| | | | |
|---|---|---|---|
| 6,136,497 A * | 10/2000 | Melisaris ............... | G03F 7/0037 264/401 |
| 6,287,745 B1 * | 9/2001 | Yamamura et al. ......... | 430/269 |
| 6,565,969 B1 * | 5/2003 | Lamon ....................... | C09J 7/00 428/195.1 |
| 6,727,035 B2 | 4/2004 | Yamamura et al. | |
| 6,730,734 B1 | 5/2004 | Hamilton et al. | |
| 6,894,113 B2 | 5/2005 | Court et al. | |
| 2002/0132872 A1 | 9/2002 | Yamamura et al. | |
| 2003/0149189 A1 * | 8/2003 | Cheung et al. ............ | 525/332.9 |
| 2003/0207959 A1 | 11/2003 | Napadensky et al. | |
| 2004/0034124 A1 | 2/2004 | Court et al. | |
| 2004/0106692 A1 * | 6/2004 | Yamamura et al. .......... | 522/113 |
| 2004/0137368 A1 * | 7/2004 | Steinmann ................. | 430/280.1 |

FOREIGN PATENT DOCUMENTS

| | | |
|---|---|---|
| EP | 0 646 580 | 4/1995 |
| EP | 0 938 026 | 8/1999 |
| EP | 1 290 088 B1 | 5/2001 |
| EP | 1 437 624 | 7/2004 |
| EP | 2 118 169 B1 | 3/2008 |
| JP | 04300954 A2 | 10/1992 |
| JP | 11240939 A2 | 9/1999 |
| JP | 2003-192887 A2 | 7/2003 |
| JP | 2003-238691 A2 | 8/2003 |
| WO | WO 00/63272 A1 | 10/2000 |
| WO | WO 01/75524 | 10/2001 |
| WO | WO 01/95030 A2 | 12/2001 |
| WO | WO 03/063572 A2 | 8/2003 |
| WO | WO 2005/014699 A1 | 2/2005 |
| WO | WO 2006/077153 A2 | 7/2006 |
| WO | WO 2007/009957 A1 | 1/2007 |

OTHER PUBLICATIONS

International Search Report for PCT/EP2007/003676, mailed Sep. 9, 2007.
Office Action in related Japanese Application No. P2009-508176; Dispatch Date: Jun. 5, 2012 11 pgs; In Japanese with English Translation.
Fine, et al, "Structures and reological properties of reactive solutions of block copolymers, Part I. Diblock copolymers in a liquid epoxy monomer," Polymer, vol. 46, May 23, 2005, pp. 6605-6613.
Kris Verschueren and Balwant Kaur, Cycloaliphatic Epoxide Resins for Cationic UV-Cure, UCB Chemicals s.a. Chemical Sector, Belgium, UCB Chemicals (Malaysia) Sdn Bhd., RadTech Asia pp. 269-274 (1999).

* cited by examiner

*Primary Examiner* — Mark Eashoo
*Assistant Examiner* — Jessica Roswell
(74) *Attorney, Agent, or Firm* — Daniel S. Bujas (57) ABSTRACT

The invention relates to a radiation curable resin composition comprising a cationically polymerizable component, a cationic photoinitiator, a hydroxy component, an impact modifier and wherein the resin composition after full cure has a modulus of >2 GPa; a yield stress <70 MPa; and a $K_{1c}$ value >1.3 MPa·$(m)^{1/2}$ or an Izod value >0.45 J/cm. The resin composition can preferably be used in the preparation of three dimensional objects.

20 Claims, 1 Drawing Sheet

RADIATION CURABLE RESIN COMPOSITION AND RAPID THREE DIMENSIONAL IMAGING PROCESS USING THE SAME

This application is the U.S. national phase of International Application No. PCT/EP2007/003676 filed 26 Apr. 2007 which designated the U.S. and claims priority to U.S. Provisional Application Nos. 60/796,197 filed 1 May 2006 and 60/907,002 filed 16 Mar. 2007, the entire contents of each of which are hereby incorporated by reference.

FIELD OF THE INVENTION

The present invention relates to radiation curable compositions which are particularly suitable for the production of three-dimensional shaped articles by means of layerwise imaging methods, such as stereolithography, 3D printing and Digital Light Processing, to a process for the production of a cured product and, in particular, for the stereolithographic production of three dimensional shaped articles from this composition having excellent mechanical properties.

BACKGROUND OF THE INVENTION

The production of three-dimensional articles of complex shape by means of stereolithography has been known for a number of years. In this technique the desired shaped article is built up from a radiation-curable composition with the aid of a recurring, alternating sequence of two steps (a) and (b). In step (a), a layer of the radiation-curable composition, one boundary of which is the surface of the composition, is cured with the aid of appropriate imaging radiation, preferably imaging radiation from a computer-controlled scanning laser beam, within a surface region which corresponds to the desired cross-sectional area of the shaped article to be formed, and in step (b) the cured layer is covered with a new layer of the radiation-curable composition, and the sequence of steps (a) and (b) is repeated until a so-called green model of the desired shape is finished. This green model is, in general, not yet fully cured and may therefore be subjected to post-curing, though such post curing is not required.

Via an equivalent process, photopolymer can be jetted by inkjet or multiple ink jet processes in an imagewise fashion. While jetting the photopolymer or after the photopolymer is applied actinic exposure can be provided to initiate polymerization. Multiple materials (for example non-reactive waxes, weakly reacting photopolymers, photopolymers of various physical properties, photopolymers with various colors or color formers, etc.) can be jetted or applied to provide supports or alternate cured properties. An alternative process is Digital Light Processing, wherein where by an entire layer can be radiation cured simultaneously.

The mechanical strength of the green model (modulus of elasticity, fracture strength), also referred to as green strength, constitutes an important property of the green model and is determined essentially by the nature of the stereolithographic-resin composition employed in combination with the type of stereolithography apparatus used and degree of exposure provided during part fabrication. Other important properties of a stereolithographic-resin composition include a high sensitivity for the radiation employed in the course of curing and a minimum amount of curl or shrinkage deformation, permitting high shape definition of the green model. In addition, for example, it should be relatively easy to coat a new layer of the stereolithographic resin composition during the process. Of course, not only the green model but also, and even more important, the final cured article should have optimum mechanical properties meeting with the end-use requirements.

The developments in this area of technology move towards compositions having better mechanical properties in order to better simulate properties of commodity materials like polypropylene and engineering type polymers like e.g. polyamides (PA6, PA66, . . . ) and polyesters (PET, PBT). Also there exists a requirement for faster cure and process speeds, so as to decrease the time to build a part. This has resulted in new stereolithography machines having solid state lasers that have a high energy output, very fast laser-scanning and faster recoating processes. The new machines supply UV light with a power around 800 mW and above, compared to 200-300 mW for the older conventional machines. Also the scanning time is reduced by 3 to 4 times. These high powers, high scanning speeds, and short recoating times result in higher temperatures, due to polymerization exotherm of the resins and parts during fabrication. Typical temperatures have risen to values between 50 and 90° C., which may lead to part distortion and excessive color development.

Several patent publications are known that describe resin compositions that can be used in rapid prototyping and aim at improving mechanical properties of the three dimensional articles. Examples of such patent publications are EP 831127, EP 848294, EP 938026, EP 1437624, JP 2003-238691, U.S. Pat. No. 6,833,231, US2003-198824, US 2004-013977, US 2005-072519, US 2005-0175925, WO 9950711, WO 0063272, WO 04111733 and WO 04113395. Sometimes articles are produced that have a high (tensile) modulus, but these articles have a low toughness/impact resistance. Other references provide articles having high impact resistance, but they have a very low modulus. Resin compositions that give after full cure an article that possesses both a high modulus and a high impact resistance are not disclosed in literature.

OBJECTS OF THE INVENTION

It is an object of the present invention to provide resin compositions that after full cure show high (tensile) modulus and high toughness as shown by high impact strength and/or high resistance against crack propagation (fracture toughness).

A second object of the invention is to provide photocurable resin compositions useful for production of three-dimensional parts with complex geometries and excellent mechanical properties.

Another object of the invention is to provide photocurable resin compositions that can be used for rapid manufacture of durable custom and semi-custom parts.

A further object of the invention is to provide resin compositions that can be easily used in stereolithography machines.

SUMMARY OF THE INVENTION

The present invention relates to a radiation curable composition comprising
 a. a cationically polymerizable component
 b. a cationic photoinitiator
 c. a hydroxy component
 d. an impact modifier
 wherein the resin composition after full cure has a tensile modulus of >2 GPa; a yield stress <70 MPa; and a $K_{1c}$ value >1.3 MPa·(m)$^{1/2}$ or an Izod value >0.45 J/cm.

Another embodiment of the present invention relates to a radiation curable composition comprising
a. 5-90 wt % of an epoxy functional component
b. 0.1-10 wt % of a cationic photoinitiator
c. 1-35 wt % of a polyol
d. 1-30 wt % of core shell particles
e. 1-35 wt % of a compound having at least one (meth)acrylate group
f. 0.1-15 wt % of a radical photoinitiator
g. 0-25 wt % of a compound having at least one radically curable group and one cationically curable group,
wherein the epoxy/hydroxy ratio of the composition is in the range from 2-5, the epoxy/(meth)acrylate ratio is in the range from 4.5-15 and the aromatic/cycloaliphatic content is between 0.2 and 0.6.

DETAILED DESCRIPTION OF THE INVENTION (A) Cationically Polymerizable Component
(A1) Epoxies The cationically polymerizable component preferably contains at least one epoxy-group containing component. The epoxide-containing components that are used in the compositions, according to this invention, are compounds that possess on average at least one 1,2-epoxide group in the molecule. By "epoxide" is meant the three-membered ring The epoxide-containing components, also referred to as epoxy materials, are cationically curable, by which is meant that polymerization and/or crosslinking and other reaction of the epoxy group is initiated by cations. The materials can be monomeric, oligomeric or polymeric and are sometimes referred to as "resins." Such materials may have an aliphatic, aromatic, cycloaliphatic, arylaliphatic or heterocyclic structure; they comprise epoxide groups as separate groups, or those groups form part of an alicyclic or heterocyclic ring system. Epoxy resins of those types are generally known and are commercially available.

The epoxide-containing material (a) should comprise at least one liquid component such that the combination of materials is a liquid. Thus, the epoxide-containing material can be a single liquid epoxy material, a combination of liquid epoxy materials, or a combination of liquid epoxy material(s) and solid epoxy material(s) which is soluble in the liquid.

Examples of suitable epoxy materials include polyglycidyl and poly(methylglycidyl) esters of polycarboxylic acids, or poly(oxiranyl)ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be poly(tetramethylene oxide). It is likewise possible to use carboxyterminated adducts, for example, of trimellitic acid and polyols, such as, for example, glycerol or 2,2-bis(4-hydroxycyclohexyl)propane.

Suitable epoxy materials also include polyglycidyl or poly(-methylglycidyl)ethers obtainable by the reaction of a compound having at least one free alcoholic hydroxy groups and/or phenolic hydroxy groups and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane.

The epoxy compounds may also be derived from mononuclear phenols, such as, for example, from resorcinol or hydroquinone, or they may be based on polynuclear phenols, such as, for example, bis(4-hydroxyphenyl)methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs.

Examples of suitable epoxy materials include poly(S-glycidyl) compounds which are di-S-glycidyl derivatives which are derived from dithiols, such as, for example, ethane-1,2-dithiol or bis(4-mercaptomethylphenyl)ether.

Other examples of suitable epoxy materials include bis(2,3-epoxycyclopentyl)ether, 2,3-epoxy cyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methyl-cyclohexanecarboxylate, di(3,4-epoxycyclohexylmethyl) hexanedioate, di(3,4-epoxy-6-methylcyclohexylmethyl) hexanedioate, ethylenebis(3,4-epoxycyclohexanecarboxylate), ethanedioldi(3,4-epoxycyclohexylmethyl)ether, vinylcyclohexene dioxide, dicyclopentadiene diepoxide, α-(oxiranylmethyl)-ω-(oxiranylmethoxy)poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof.

It is, however, also possible to use epoxy resins in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl) propane.

In addition, liquid prereacted adducts of such epoxy resins with hardeners are suitable for epoxy resins.

It is of course also possible to use mixtures of epoxy materials in the compositions according to the invention.

Preferred epoxy materials are cycloaliphatic diepoxides. Especially preferred are 3,4-epoxycyclohexylmethyl-3,4-epoxycyclohexanecarboxylate, and combinations thereof. Other preferred epoxy materials are based on polynuclear phenols, such as, for example, bis(4-hydroxyphenyl)methane (bisphenol F), 2,2-bis(4-hydroxyphenyl)propane (bisphenol A), or oligomers thereof. The epoxy materials can have molecular weights which vary over a wide range. In general, the epoxy equivalent weight, i.e., the number average molecular weight divided by the number of reactive epoxy groups, is preferably in the range of 44 to 1000.

(A2) Oxetane Group Containing Component

The compositions of the present invention may also contain oxetanes as cationically polymerizable component. An oxetane compound comprises at least one oxetane ring shown by the following formula (1).

(1)

The oxetane compound can be polymerised or crosslinked by irradiation with light in the presence of a cationically polymerizable photoinitiator.

Examples of oxetanes having one oxetane ring in the molecule are shown by the following formula (2):

(2)

wherein Z represents an oxygen atom or sulphur atom; R1 represents a hydrogen atom, fluorine atom, an alkyl group having 1-6 carbon atoms such as a methyl group, ethyl group, propyl group, and butyl group, a fluoroalkyl group having 1-6 carbon atoms such as trifluoromethyl group, perfluoroethyl group, and perfluoropropyl group, an aryl group having 6-18 carbon atoms such as a phenyl group and naphthyl group, a furyl group, or a thienyl group; and R2 represents a hydrogen atom, an alkyl group having 1-6 carbon atoms for example a methyl group, ethyl group, propyl group, and butyl group, an alkenyl group having 2-6 carbon atoms for example a 1-propenyl group, 2-propenyl group, 2-methyl-1-propenyl group, 2-methyl-2-propenyl group, 1-butenyl group, 2-butenyl group, and 3-butenyl group, an aryl group having 6-18 carbon atoms for example a phenyl group, naphthyl group, anthranyl group, and phenanthryl group, a substituted or unsubstituted aralkyl group having 7-18 carbon atoms for example a benzyl group, fluorobenzyl group, methoxy benzyl group, phenethyl group, styryl group, cynnamyl group, ethoxybenzyl group, a group having other aromatic rings for instance an aryloxyalkyl for example a phenoxymethyl group and phenoxyethyl group, an alkylcarbonyl group having 2-6 carbon atoms for example an ethylcarbonyl group, propylcarbonyl group, butylcarbonyl group, an alkoxy carbonyl group having 2-6 carbon atoms for example an ethoxycarbonyl group, propoxycarbonyl group, butoxycarbonyl group, an N-alkylcarbamoyl group having 2-6 carbon atoms such as an ethylcarbamoyl group, propylcarbamoyl group, butylcarbamoyl group, pentylcarbamoyl group, or a polyethergroup having 2-1000 carbon atoms.

Examples of oxetane compounds having two oxetane rings in the molecule are compounds shown by the following formula (3):

(3)

wherein R1 is the same as defined for the above formula (2); R3 represents a divalent organic group, like for example a linear or branched alkylene group having 1-20 carbon atoms for example an ethylene group, propylene group, and butylene group, a linear or branched poly(alkyleneoxy) group having 1-120 carbon atoms for example a poly(ethyleneoxy) group and poly(propyleneoxy) group, a linear or branched unsaturated hydrocarbon group for example a propenylene group, methylpropenylene group, and butenylene group.

As specific examples of the compounds having two oxetane rings in the molecule, compounds shown by the following formulas (9), and (10) can be given.

(9)

(10)

In the formula (10), R1 is the same as defined for the above formula (2).

Specific examples of oxetane compounds are given below.

Compounds containing one oxetane ring in the molecule: 3-ethyl-3-hydroxymethyloxetane, 3-(meth)allyloxymethyl-3-ethyloxetane, (3-ethyl-3-oxetanylmethoxy)methylbenzene, (3-ethyl-3-oxetanylmethoxy)benzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl)ether, isobornyloxyethyl (3-ethyl-3-oxetanylmethyl)ether, isobornyl (3-ethyl-3-oxetanylmethyl)ether, 2-ethylhexyl (3-ethyl-3-oxetanyl methyl)ether, ethyldiethylene glycol (3-ethyl-3-oxetanylmethyl)ether, dicyclopentadiene (3-ethyl-3-oxetanylmethyl) ether, dicyclopentenyloxyethyl (3-ethyl-3-oxetanyl methyl) ether, dicyclopentenyl (3-ethyl-3-oxetanylmethyl)ether, tetrahydrofurfuryl (3-ethyl-3-oxetanylmethyl)ether, tetrabromophenyl (3-ethyl-3-oxetanylmethyl)ether, 2-tetrabromophenoxyethyl (3-ethyl-3-oxetanylmethyl)ether, tribromophenyl (3-ethyl-3-oxetanylmethyl)ether, 2-tribromophenoxyethyl (3-ethyl-3-oxetanylmethyl)ether, 2-hydroxyethyl (3-ethyl-3-oxetanyl methyl)ether, 2-hydroxypropyl (3-ethyl-3-oxetanylmethyl)ether, butoxyethyl (3-ethyl-3-oxetanylmethyl)ether, pentachlorophenyl (3-ethyl-3-oxetanylmethyl)ether, pentabromophenyl (3-ethyl-3-oxetanylmethyl)ether, bornyl (3-ethyl-3-oxetanylmethyl)ether.

Compounds containing two or more oxetane rings in the molecule: 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis (3-ethyl-3-oxetanylmethyl)ether, tricyclodecanediyldimethylene (3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl)ether. These compounds can be used either individually or in combination of two or more.

Preferred oxetanes are selected from the group consisting of components defined by formula 2, wherein $R^1$ is a C1-C4 alkyl group, Z=Oxygen and $R^2$=H, a C1-C8 alkyl group or a phenylgroup; 3-ethyl-3-hydroxymethyloxetane, (3-ethyl-3-oxetanylmethoxy)methylbenzene, (3-ethyl-3-oxetanylmethoxy)benzene, 2-ethylhexyl (3-ethyl-3-oxetanyl methyl) ether, 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether and bis(3-ethyl-3-oxetanylmethyl)ether.

The oxetane compounds can be used either individually or in combinations of two or more.

(A3) Other Cationically Polymerizable Components

Other cationically polymerizable components that may be used in the composition of the present invention include, for instance, cyclic lactone compounds, cyclic acetal compounds, cyclic thioether compounds, Spiro orthoester compounds, and vinylether compounds.

It is of course possible to use mixtures of cationically polymerizable components in the compositions according to the invention.

In one embodiment of the invention the composition of the invention may contain cationically polymerizable components having a cationically curable group and at least one hydroxyl group. Preferably this component will have one cationically curable group and one or more hydroxyl groups. It is believed that such components will also contribute to making a three dimensional object having a network with intermediate cross-link density.

Preferably the composition of the present invention comprises, relative to the total weight of the composition, at least 30 wt %, more preferably at least 40 wt %, and most preferably at least 60 wt % of cationically curable components. Preferably the composition of the invention comprises, relative to the total weight of the composition, less than 90 wt %, and more preferably less than 80 wt % cationically curable components.

(B) Cationic Photoinititator

In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring), and both books are hereby incorporated in their entirety by reference.

Preferred initiators include diaryl iodonium salts, triaryl sulfonium salts, or the like. Typical photo-polymerization initiators are represented by the following formulae (11) and (12):

(11)

(12)

wherein $Q_3$ represents a hydrogen atom, an alkyl group having 1 to 18 carbon atoms, an alkoxyl group having 1 to 18 carbon atoms a thiophenyl group or a group represented by the formula (12a):

(12a)

M represents a metal atom, preferably antimony;
Z represents a halogen atom, preferably fluorine; and
t is the valent number of the metal, for example 6 in the case of antimony.

Preferred cationic photoinitiators include iodonium photoinitiators, e.g. iodonium tetrakis(pentafluorophenyl) borate, because they tend to be less yellowing, especially when used in combination with photosensitizers such as, for instance, n-ethyl carbazole.

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples are polycyclic aromatic hydrocarbons or aromatic keto compounds. Specific examples of preferred sensitizers are mentioned in published European patent application EP 153904. Other preferred sensitizers are benzoperylene, 1,8-diphenyl-1,3,5,7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation.

Preferably, the present composition comprises, relative to the total weight of the composition, 0.1-15 wt % of one or more cationic photoinitiators, more preferably 1-10 wt %.

(C) Hydroxy Functional Components

The composition of the invention contains at least one hydroxy component, which is a polyol having at least 2 hydroxyl groups. The hydroxy component used in the present invention is a polyol which may contain primary and/or secondary hydroxyl groups. It is preferred that the hydroxyl component contains at least one primary hydroxyl group. Primary hydroxyl groups are OH-groups, which are covalently bonded to a carbon atom having 2 or 3 hydrogen atoms. Preferably the hydroxy component contains two primary hydroxyl groups. In another preferred embodiment of the present invention the hydroxy component is a compound having primary hydroxyl groups and/or secondary hydroxyl groups located at the terminus of an alkyl or alkoxy chain, wherein the alkyl or alkoxy chain may have from 1 to 100 C-atoms, preferably from 2 to 50 C atoms, more preferably from 5-40 C atoms. While not wishing to be bound by theory, we believe these primary and secondary hydroxyl groups preferably function as chain transfer agents in the cationic polymerization reaction. Mixtures of different hydroxyl compounds may also be used.

The hydroxyl component may be a diol of molecular weight less than 200 wherein preferably one, and more preferably both, hydroxyl groups are primary hydroxyl groups. Examples of suitable diols include: ethylene glycol, 1,2-propanediol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, diethylene glycol, triethyleneglycol, tetraethylene glycol, dipropylene glycol and tripropylene glycol.

The hydroxy component preferably is a molecule that has a central structure to which have been added chain extensions of, for example, ethylene oxide or propylene oxide. Preferably the hydroxy component is an alkoxylated polyol or an alkoxylated aromatic diol. More preferably the hydroxy component is an ethoxylated polyol or ethoxylated aromatic diol.

Examples of suitable hydroxy components are oligomeric and polymeric hydroxyl-containing materials include polyoxyethylene and polyoxypropylene glycols and triols of molecular weights from about 200 to about 1500 g/mol; polytetramethylene glycols of varying molecular weight; poly(oxyethylene-oxybutylene) random or block copolymers; hydroxy-terminated polyesters and hydroxy-terminated polylactones; hydroxy-functionalized polyalkadienes, such as polybutadiene; aliphatic polycarbonate polyols, such as an aliphatic polycarbonate diol; hydroxy-terminated polyethers; and alkoxylated aromatic diols represented by the chemical structure shown:

wherein R3=—CH$_2$—, —C(CH$_3$)$_2$—, —C(CF$_3$)$_2$—, —CCl$_2$—, —O—, —S—, and
R4=—CH$_2$CH$_2$— or —CH$_2$CH(CH$_3$)—, and n and m are 1 through 10.

In one embodiment of the invention, the hydroxy component preferably comprises an ethoxylated bisphenol A. The ethoxylated bisphenol A may for example contain between 1 and 30 ethoxylations per hydroxyl group, preferably from 2 to 20 ethoxylations per hydroxyl group. In another embodiment of the invention, the hydroxy component preferably comprises a propoxylated bisphenol A. The propoxylated bisphenol A may for example contain between 1 and 30 propoxylations per hydroxyl group, preferably from 2 to 20 propoxylations per hydroxyl group.

In yet another embodiment of the invention, the hydroxy component preferably comprises a bisphenol A with mixed ethoxylations and propoxylations. This bisphenol A may for example contain in total between 1 and 30 ethoxylations and/or propoxylations per hydroxyl group, preferably from 2 to 20 ethoxylations/propoxylations per hydroxyl group.

Other preferred hydroxyl components are polyether polyols obtained by modifying a polyhydric alcohol containing three or more hydroxyl groups, such as trimethylolpropane, glycerol, pentaerythritol, sorbitol, sucrose, or quadrol, with a cyclic ether compound, such as ethylene oxide (EO), propylene oxide (PO), butylene oxide, or tetrahydrofuran. Specific examples include EO-modified trimethylolpropane, PO-modified trimethylolpropane, tetrahydrofuran-modified trimethylolpropane, EO-modified glycerol, PO-modified glycerol, tetrahydrofuran-modified glycerol, EO-modified pentaerythritol, PO-modified pentaerythritol, tetrahydrofuran-modified pentaerythritol, EO-modified sorbitol, PO-modified sorbitol, EO-modified sucrose, PO-modified sucrose, and EO-modified quadrol. Of these, EO-modified trimethylolpropane, PO-modified trimethylolpropane, EO-modified glycerol, and PO-modified glycerol are preferable.

The molecular weight of the hydroxyl component is preferably 100-1500, and more preferably 160-1000 g/mol. The proportion of the hydroxyl component used in the liquid photocurable resin composition of the present invention is usually 1-35 wt %, preferably 5-30 wt %, and particularly preferably 5-25 wt %.

(D) Impact Modifier

The composition of the present invention comprises at least one impact modifier. Examples of suitable impact modifiers are elastomers and, more preferably, pre-fabricated elastomer particles. These elastomers have a glass transition temperature (Tg) lower than 0° C., as determined with DSC.

The composition according to the present invention preferably contains 1-30 wt % impact modifier. The impact modifier preferably comprises elastomer particles having an average size between 10 nm and 10 μm.

(D1) Elastomers

Given as examples of impact modifying component (D), which can be dispersed into the radiation curable resin composition, are elastomers based on copolymers of ethylene or propylene and one or more C2 to C12 α-olefin monomers.

Examples of such are ethylene/propylene copolymers or ethylene/propylene copolymers, optionally containing a third copolymerizable diene monomer (EPDM), such as 1,4-hexadiene, dicyclopentadiene, di-cyclooctadiene, methylene norbornene, ethylidene norbornene and tetrahydroindene; ethylene/α-olefin copolymers, such as ethylene-octene copolymers and ethylene/α-olefin/polyene copolymers.

Other suitable elastomers are polybutadiene, polyisoprene, styrene/butadiene random copolymer, styrene/isoprene random copolymer, acrylic rubbers (e.g. polybutylacrylate), ethylene/acrylate random copolymers and acrylic block copolymers, styrene/butadiene/(meth)acrylate (SBM) block-copolymers, styrene/butadiene block copolymer (styrene-butadiene-styrene block copolymer (SBS), styrene-isoprene-styrene block copolymer (SIS) and their hydrogenated versions, SEBS, SEPS), and (SIS) and ionomers.

Commercial examples of elastomers are Kraton (SBS, SEBS, SIS, SEBS and SEPS) block copolymers produced by Shell, Lotryl ethyl/acrylate random copolymer (Arkema) and Surlyn ionomers (Dupont).

Optionally, the elastomer may be modified to contain reactive groups such as e.g. epoxy, oxetane, carboxyl or alcohol. This modification can e.g. be introduced by reactive grafting or by copolymerization. Commercial examples of the latter are the Lotader random ethylene/acrylate copolymers AX8840 (glycidyl methacrylate/GMA modified), AX8900 and AX8930 (GMA and maleic anhydride modified/MA) produced by Arkema.

Optionally, the elastomer may be crosslinked after mixing into the radiation curable resin composition. The crosslinking structure may be introduced via a conventional method. As examples of crosslinking agents used in such a materials peroxide, sulfur, resol and the like, optionally in combination with multifunctional monomers like divinylbenzene, ethylene glycol di(meth)acrylate, diallylmaleate, triallylcyanurate, triallylisocyanurate, diallylphthalate, trimethylolpropane triacrylate, allyl methacrylate and the like can be given.

(D2) Pre-Fabricated Elastomer Particles

Examples of a more preferable impact modifier (D) that can be dispersed into the radiation curable resin composition are pre-fabricated elastomer particles. Elastomer particles may be prepared by a variety of means, including those obtained by isolation from latex made via emulsion polymerization, grinding or cryo-grinding of elastomer stock, or preparation in-situ in another component of the composition. The average size of these elastomer particles is preferably between 10 nm and 10 μm.

Examples of commercial sources of such pre-fabricated elastomer particles are PB (polybutadiene) or PBA (polybutylacrylate) latices available with varying average particle size from various producers, or latices obtained by emulsification of EPDM, SBS, SIS or any other rubber.

Optionally, the elastomer may contain a crosslinking structure. The crosslinking structure may be introduced by a conventional method. As examples of crosslinking agents used in such a material peroxide, sulfur, resol and the like, optionally in combination with multifunctional monomers like divinylbenzene, ethylene glycol di(meth)acrylate, diallylmaleate, triallylcyanurate, triallylisocyanurate, diallylphthalate, trimethylolpropane triacrylate, allyl methacrylate, and the like can be given.

Optionally, a shell may be present on the particles that can e.g. be introduced via grafting or during a second stage of emulsion polymerization. Examples of such particles are core-shell impact modifier particles that contain a rubber core and a glassy shell. Examples of core materials are polybutadiene, polyisoprene, acrylic rubber (e.g. polybutylacrylate rubber), styrene/butadiene random copolymer, styrene/isoprene random copolymer, or polysiloxane. Examples of shell materials or graft copolymers are (co)polymers of vinyl aromatic compounds (e.g. styrene) and vinyl cyanides (e.g. acrylonitrile) or (meth)acrylates (e.g. MMA).

Optionally, reactive groups can be incorporated into the shell by copolymerization, such as copolymerisation with glycidyl methacrylate, or by treatment of the shell to form reactive functional groups. Suitable reactive functional groups include, but are not limited to, epoxy groups, oxetane groups, hydroxyl groups, carboxyl groups, vinyl ether groups, and/or acrylate groups.

Examples of commercially available products of these core-shell type elastomer particles are Resinous Bond RKB (dispersions of core-shell particles in epoxy manufactured by Resinous Chemical Industries Co., Ltd.), Durastrength D400, Durastrength 400R (manufactured by Arkema Group), Paraloid EXL-2300 (non-functional shell), Paraloid EXL-2314 (epoxy functional shell), Paraloid EXL-2600, Paraloid EXL-3387 and Paraloid KM-365 (manufactured by Rohm and Haas), Genioperl P53, Genioperl P23, Genioperl P22 (manufactured by Wacker Chemical) and the like.

Another example of such elastomer particles are crosslinked polyorganosiloxane rubbers that may include dialkylsiloxane repeating units, where "alkyl" is $C_1$-$C_6$ alkyl. Such particles may be made by the method disclosed in U.S. Pat. No. 4,853,434 to Block, incorporated in its entirety herein by reference. The particles may be modified to include reactive groups such as oxirane, glycidyl, oxetane, hydroxyl, vinyl ester, vinyl ether, or (meth)acrylate groups, or combinations thereof, preferably on the surface of the particles.

Examples of polyorganosiloxane elastomer particles that are commercially available are Albidur EP 2240(A), Albidur EP 2640, Albidur VE 3320, Albidur EP 5340, Albidur EP 5640, and Albiflex 296 (dispersions of particles in epoxy or vinyl ether resins, Hanse Chemie, Germany), Genioperl M41C (dispersion in epoxy, Wacker Chemical), Chemisnow MX Series and MP Series (Soken Chemical and Engineering Co.).

Other materials that can be used to make the core/shell particles for use in the present invention can be found in for example: Nakamura et al J Appl Polym Sci v 33 n 3 Feb. 20, 1987 p 885-897, 1987, which discloses a core/shell material with a poly(butyl acrylate) core and poly(methyl methacrylate) shell. The shell has been treated so that it contains epoxide groups; Saija, L. M. and Uminski, M., Surface Coatings International Part B 2002 85, No. B2, June 2002, p. 149-53, which describes a core shell material with core and shell prepared from poly(methyl methacrylate-co-butyl acrylate), and treated with MMA or AMPS to produce material with carboxylic acid groups on the surface; Aerdts, A. M et al, Polymer 1997 38, No. 16, 1997, p. 4247-52, which describes a material using polystyrene, poly(methyl methacrylate) or polybutadiene as its core. An epoxidized poly(methyl methacrylate) is used for the shell. The epoxide sites are reactive sites on the core of this material.

The core shell particles can include more than one core and/or more than one shell. In addition, mixtures of core-shell particles with elastomer particles can be used.

The elastomer particles, or the elastomeric core of the core-shell particles, preferably have a Tg below 0° C., as determined with DSC.

(D3) Miscible Compounds that Demix into Rubbery Domains Upon Curing.

The compositions according to the present invention may also contain one or more dissolved components that demix upon curing into rubbery domains. These components generally contain at least one elastomeric block with a Tg below 0° C., which assembles into elastomeric domains. The components may contain functional groups, for example epoxy, hydroxyl, (meth)acrylate, vinyl ether etc. The molecular weight of the (D3) components is in general higher then 1500 g/mol.

Examples of these are epoxy- or carboxyterminated butadiene-nitrile rubbers (ETBN, CTBN). Other examples are epoxy, hydroxy or (meth)acrylate functional low Tg oligomers. In the case where the oligomer is hydroxy-functional, the impact modifier may also act as chain transfer agent and needs to be included in the calculation of the hydroxy content as described in the following paragraph. In this case, it is preferred that also a low molecular weight hydroxy component is present in the composition.

Commercial examples of CTBN's are the EPON Resin 58000, e.g. 58003, 58005, 58006, 58042, 58901 and 58034. Examples of epoxy- or hydroxy functional low Tg oligomers with molecular weight larger then 1500 g/mol are the Acclaim series of polypropylene glycols with varying molecular weight (Bayer), the Terathane series of polytetramethylene glycols (Dupont); poly(oxyethylene-oxybutylene) random or block copolymers; pTGL by Hodogaya Chemical Co. Ltd, hydroxy-terminated polyesters and hydroxy-terminated polylactones such as the Placcel 220 series produced by Daicel; hydroxy-functionalized polyalkadienes, such as polybutadiene; aliphatic polycarbonate polyols, such as an aliphatic polycarbonate diol; hydroxy-terminated polyethers or commercially available epoxide/aliphatic polyol blends such as Uvacure 1530, 1531, 1532, 1533 and 1534 (UCB Chemicals). Other examples are Nanostrength block copolymers E20, E40 (SBM type) and M22 (full-acrylic) as produced by Arkema.

Cationically Polymerizable/Hydroxy Ratio

The composition of the present invention preferably has a cationically polymerizable/hydroxy ratio between 2.0 and 5.0. The cationically polymerizable/hydroxy ratio (Cat. Poly./Hydroxy) is the amount of cationically polymerizable functional groups divided by the amount of hydroxy functional groups present in the composition. The amount of cationically polymerizable groups is calculated by determining the number (mmoles) of cationically polymerizable groups present in 100 grams of the composition. Cationically polymerizable groups include epoxy, oxetane, tetrahydrofuran, cyclic lactone, cyclic acetal, cyclic thioether, spiro orthoester, and vinylether groups. The amount of hydroxy groups (or hydroxy value) is calculated by determining the number (mmol) of hydroxy groups present in 100 grams of the composition. Only hydroxyl groups present in the cationically polymerizable component (A) and in the hydroxy component (C) (and optionally hydroxyl group containing components (D3)) are taken into account in calculating the hydroxy value. Other components may also contain hydroxy groups (for example some (meth)acrylate compounds and radical photoinitiators), but they are not expected to have a strong chain transfer effect on the cationic polymerization and are for this reason and for reasons of simplicity kept out of the calculation.

In case the cationically polymerizable groups are epoxy groups, one may also describe the cationically polymerizable/hydroxy ratio as the epoxy/hydroxy ratio.

The cationically polymerizable/hydroxy ratio preferably ranges from 2.2 to 4.75, and most preferably from 2.4 to 4.5.

(E) Radically Polymerizable Compound

The composition of the present invention may also contain radically polymerizable compounds. Suitable examples of radical polymerizable compounds are compounds having one or more ethylenically unsaturated groups, for example compounds having acrylate or methacrylate groups.

Examples of monofunctional ethylenically unsaturated compounds include isobornyloxyethyl(meth)acrylate, isobornyl(meth)acrylate, 2-ethylhexyl(meth)acrylate, ethyldiethylene glycol(meth)acrylate, lauryl(meth)acrylate, dicyclopentadiene(meth)acrylate, dicyclopentenyloxyethyl(meth)acrylate, dicyclopentenyl(meth)acrylate, 2-tetrachlorophenoxyethyl(meth)acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl (meth)acrylate,2-hydroxypropyl(meth)acrylate, phenoxyethyl(meth)acrylate, butoxyethyl(meth)acrylate, pentachlorophenyl(meth)acrylate, pentabromophenyl(meth)acrylate, polyethylene glycol mono(meth)acrylate, polypropylene glycol mono(meth)acrylate, bornyl(meth)acrylate and, methyltriethylene diglycol(meth)acrylate.

Examples of the polyfunctional radically polymerizable compounds include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, trimethylolpropane tri(meth)acrylate, ethylene oxide (hereinafter may be abbreviated as "EO") modified trimethylolpropane tri(meth)acrylate, propylene oxide (hereinafter may be abbreviated as "PO") modified trimethylolpropane tri(meth)acrylate, tripropylene glycol di(meth)acrylate, neopentyl glycol di(meth)acrylate, both-terminal (meth)acrylic acid adduct of bisphenol A diglycidyl ether, 1,4-butanediol di(meth)acrylate, 1,6-hexanediol di(meth)acrylate, pentaerythritol tri(meth)acrylate, pentaerythritol tetra(meth)acrylate, polyethylene glycol di(meth)acrylate, dipentaerythritol hexa(meth)acrylate, dipentaerythritol penta(meth)acrylate, dipentaerythritol tetra(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like.

Preferred radically polymerizable compounds are selected from the group consisting of bisphenol A diglycidylether diacrylate and mono-acrylate, dipentaerithritol hexacrylate and pentacrylate, trimethylolpropane triacrylate, neopentylglycol propoxylated diacrylate and isobornyl acrylate.

Each of the above mentioned radically polymerizable compounds can be used either individually or in combinations of two or more, or in combinations of at least one monofunctional monomer and at least one polyfunctional monomer.

The content of the radically polymerizable compound that may be used in the photocurable resin composition of the present invention is usually 0-45 wt %, preferably 3-35 wt %. In the case of a hybrid formulation, preferably polyfunctional acrylates, having functionality between 2 and 6 are used in the compositions of the present invention in amounts between 1 and 30 wt %, more preferably 2-20 wt %, most preferably between 3 and 15 wt %, relative to the total composition.

(F) Radical Photoinitiator

The compositions of the present invention may employ one or more free radical photoinitiators. Examples of photoinitiators include benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzil diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethylbenzoyldiphenylphosphine oxide (Lucirin TPO), benzophenones, such as benzophenone, dimethoxybenzophenone, diphenoxybenzophenone, and 4,4'-bis(N,N'-dimethylamino) benzophenone, thioxanthones and xanthones, acridine derivatives, phenazene derivatives, quinoxaline derivatives or I-phenyl-1,2-propanedione-2-O-benzoyloxime, I-aminophenyl ketones or I-hydroxyphenyl ketones, such as I-hydroxycyclohexyl phenyl ketone, phenyl (1-hydroxyisopropyl)ketone and 4-isopropylphenyl(1-hydroxyisopropyl) ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds.

Especially suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 351 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, benzophenone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator.

Another class of suitable free radical photoinitiators comprises the ionic dye-counter ion compounds, which are capable of absorbing actinic rays and producing free radicals, which can initiate the polymerization of the (meth)acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541. There may be mentioned as examples of suitable ionic dye-counter ion compounds the anionic dye-iodonium ion complexes, the anionic dye-pyryllium ion complexes and, especially, the cationic dye-borate anion compounds of the following formula (10)

(10)

wherein $D^+$ is a cationic dye and $R_{12}$, $R_{13}$, $R_{14}$, and $R_{15}$ are each independently of the others alkyl, aryl, alkaryl, allyl, aralkyl, alkenyl, alkynyl, an alicyclic or saturated or unsaturated heterocyclic group. Preferred definitions for the radicals $R_{12}$ to $R_{15}$ can be found, for example, in published European patent application EP 223587.

Preferred free radical photoinitiators include 1-hydroxycyclohexyl phenyl ketone, 2-hydroxy-2-methyl-1-phenyl-propan-1-one, 2,2-dimethoxyacetophenone, benzophenone and 2,4,6-trimethylbenzoyldiphenylphosphine oxide. These photoinitiators alone or in combination with each other tend to be comparatively less yellowing.

Preferably, the present composition comprises, relative to the total weight of the composition, 0.1-15 wt % of one or more free radical photoinitiators, more preferably 1-10 wt %.

Cationically Polymerizable/Radically Polymerizable Ratio.

Compositions which are comprised of radically polymerizable components as well as cationically polymerizable components preferably have a cationically polymerizable/radically polymerizable ratio between 4 and 20. The cationically polymerizable/radically polymerizable ratio is the amount of cationically polymerizable groups divided by the amount of radically polymerizable functional groups present in the composition. The amount of cationically polymerizable groups is calculated by determining the number (mmoles) of cationically polymerizable groups present in 100 grams of the composition. The amount of radically polymerizable groups is calculated by determining the number (mmol) of (meth)acrylate and other radically polymerizable groups present in 100 grams of the composition. The cationically polymerizable/radically polymerizable ratio (Cat. Poly./Rad. Poly) is calculated by simply dividing the cationically polymerizable value by the radically polymerizable value.

In case the cationically polymerizable groups are epoxy groups, and the radically polymerizable groups are (meth)acrylate groups, one skilled man may also describe the cationically polymerizable/radically polymerizable ratio as the epoxy/(meth)acrylate ratio.

The cationically polymerizable/radically polymerizable ratio preferably ranges from 4.5 to 15, or preferably between 5 and 10, or most preferably between 5 and 9.

(G) Components with Both Cationically Polymerizable and Radically Polymerizable Groups The composition of the invention may also contain molecules which have more than one type of reactive functional groups, such that one type of functional group is capable of cationic homopolymerization while a second type of functional group on the same molecule is capable of radical polymerization. Addition of these compounds to the composition of the present invention gives the unexpected effect of increased strength of the green part and improved elongation to break. Cationically polymerizable groups include epoxy, oxetane, tetrahydrofuran, cyclic lactone, cyclic acetal, cyclic thioether, Spiro orthoester, and vinylether groups. Hydroxyl groups, which can participate in the cationic polymerization as chain transfer agents, are not included as cationically polymerizable groups since the hydroxyl groups can not be homopolymerized under cationic conditions. Moreover, hydroxyl groups which may be present in these molecules are not expected to have a strong chain transfer effect on the cationic polymerization and are for this reason and for reasons of simplicity kept out of the calculation of the cationically polymerizable/hydroxy ratio. Radically polymerizable groups include (meth)acrylates, vinyl groups, and vinylidene groups.

Commercially available materials having cationically polymerizable and free-radically polymerizable functional groups include the "Cyclomer" series, such as Cyclomer M-100, M-101, or A-200 (available from Daicel Chemical, Japan), Ebecryl-3605 (available from Radcure Specialties), VEEA or VEEM (available from Nippon Shobukai Co. Ltd. of Osaka, Japan), and CD611, SR531 or SR285 (available from Sartomer).

Components with both cationically polymerizable and radically polymerizable groups are generally present in an amount from 0-25 wt %, preferably between 1 and 20 wt %, more preferably in a range between 3 and 15 wt %.

The above compounds having both cationically polymerizable and radically polymerizable groups are included in the calculation of the cationically polymerizable/hydroxy ratio and the cationically polymerizable/radically polymerizable ratio.

(H) Additives/Other Components

Additives may also be present in the composition of the invention. Stabilizers are often added to the compositions in order to prevent a viscosity build-up, for instance a viscosity build-up during usage in a solid imaging process. Preferred stabilizers include those described in U.S. Pat. No. 5,665,792, the entire disclosure of which is hereby incorporated by reference. Such stabilizers are usually hydrocarbon carboxylic acid salts of group IA and IIA metals. Most preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative stabilizers are polyvinylpyrrolidones and polyacrylonitriles. Other possible additives/other components include dyes, pigments, fillers (e.g. silica particles—preferably cylindrical or spherical silica particles-, talc, glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, titanium oxide, aluminum powder, bronze powder, zinc powder, copper powder, lead powder, gold powder, silver dust, glass fiber, titanic acid potassium whisker, carbon whisker, sapphire whisker, beryllia whisker, boron carbide whisker, silicon carbide whisker, silicon nitride whisker, glass beads, hollow glass beads, metaloxides and potassium titanate whisker), antioxidants, wetting agents, photosensitizers for the free-radical photoinitiator, free-radical chain transfer agents, leveling agents, defoamers, surfactants and the like.

Aromatic and Cycloaliphatic Content.

The compositions of the present invention preferably have a rather high content of aromatic and/or cycloaliphatic groups. It has been found that a high content of these groups improves the modulus of the cured object, without the need for a high cross-link density, while keeping the Izod and/or K1c-value high, especially in combination with an cationically polymerizable/hydroxy ratio between 2.5 and 5.0.

The aromatic and cycloaliphatic content of the formulation can be determined by counting the number of aromatic and cycloaliphatic groups contained in each component in the composition. For each aromatic group, independent of the substitution, an average molecular weight of 76 g/mol is used. The molecular weight of a cycloaliphatic group is defined as the weight of the cycloaliphatic ring fragment of the cycloaliphatic group. In case a cycloaliphatic group is a cyclohexylgroup, a molecular weight of 82 g/mol is assumed (The weight of possible substituents is not calculated to be part of the weight of the cyclohexylgroup).

For each component in the formulation the content of aromatic and cycloaliphatic groups can be calculated by summing the weight of all aromatic and cycloaliphatic groups of the component and dividing this by the molecular weight of the component. This is the weight fraction arom/cycloaliph of a component.

Next, the content of aromatic and cycloaliphatic groups of the total composition can be calculated by summing the weight of each component in 100 g composition, multiplied by the weight fraction arom/cycloaliph of each component in the composition.

Preferably, the aromatic and cycloaliphatic content of the formulation is between 0.2 and 0.6, more preferably between 0.25 and 0.5, even more preferably between 0.3 and 0.45 and most preferably between 0.32 and 0.40.

Cross-Link Density

The compositions preferably have a medium cross-link density. It has been found that having a high cross-link density causes embrittlement of the composition. A measure for the cross-link density can be conveniently determined by examining the value of the storage modulus E' at 200° C., as measured with dynamic mechanical analysis in tension with a frequency of 1 Hz. Preferably, the storage modulus E' at 200° C. ranges between 2 and 35 MPa, more preferably between 4 and 30 MPa, even more preferably between 6 and 25 MPa and most preferred between 8 and 20 MPa.

Formulations According to the Invention

The present application claims resin compositions comprising certain components that—after full cure—give objects that have unique properties. The present invention is exemplified with many examples, which should not be regarded as limiting the scope of the present invention. The skilled man in the art may make alternative compositions that fall under the claims but may be different from the disclosed examples. One way of designing alternative compositions is by applying the following design procedure. The skilled man can make use of a two step design process, in which he first designs a matrix material (which contains the components from the composition except the impact modifier d). In this design process, a matrix material is developed which is susceptible to impact modification. This involves selection of a combination of components (all components except impact modifier d) such that a matrix material is obtained which when cured has a tensile modulus at room temperature of at least 2 GPa (preferably higher than 2.5 GPa, more preferably higher than 3 GPa) and a yield stress lower than 85 MPa, preferably lower than 80 MPa, more preferably lower than 75 MPa.

The development of such a matrix can be guided by selecting combinations of components a, b and c such that
1. the molar ratio of cationically polymerizable groups and hydroxyl groups is preferably between 2.0 and 5.0, more preferably from 2.2 to 4.75 and most preferably from 2.4 to 4.5,
2. the aromatic and cycloaliphatic content is preferably between 0.2 and 0.6, more preferably between 0.25 and 0.5 and even more preferably between 0.3 and 0.45, and most preferably between 0.32 and 0.40.

In the case a hybrid formulation is designed, e.g. for stereolitographic applications and additional design guideline is to have:
3. a molar ratio of cationically polymerizable groups and radically polymerizable groups preferably between 4.5 and 15, more preferably between 5 and 10 and most preferably between 5 and 9.

When formulated according to these guidelines a matrix material is obtained which has a proper balance of stiffness on the one hand and a sufficiently low yield stress to show yielding behavior during a tensile test. A further consequence of following these guidelines (esp. the target ratio of cationically polymerizable groups and hydroxyl groups) is that after curing a network with intermediate cross-link density is obtained. As described above this can be seen from the value of the storage modulus E' of the cured material at 200° C., measured with dynamic mechanical analysis at 1 Hz, which is preferably between 2 and 35 MPa, more preferably between 4 and 30 MPa, even more preferably between 6 and 25 MPa, and most preferred between 8 and 20 MPa. Following the guideline of the aromatic and cycloaliphatic content is preferred to obtain sufficient modulus by preventing the glass transition temperature from dropping below room temperature.

In the second step, the fracture toughness and/or the impact resistance of the material is improved by adding component d to the formulation in such an amount and type that the desired properties (as claimed) are obtained.

The comparative examples in this patent application show that parts may be obtained that have too low toughness (this is low K1c or Izod values) when the molar ratio of the cationically polymerizable groups and hydroxyl groups is too high, or the molar ratio of cationically polymerizable groups and radically polymerizable is too low. In other comparative experiments it is shown that when the aromatic and cycloaliphatic content is too low and or the molar ratio of the cationically polymerizable groups and hydroxyl groups is too low that parts are obtained that show rubbery behavior of the fully cured material at room temperature. Finally, in some cases no impact modifier is used, which also results in parts having too low K1c and/or Izod values.

Applications

The present compositions are suitable for a wide variety of applications. For instance, the compositions can be used to prepare a three dimensional object by rapid prototyping. Rapid prototyping, sometimes also referred to as "solid imaging" or "stereolithography", is a process wherein a photoformable composition is coated as a thin layer upon a surface and exposed imagewise to actinic radiation such that the composition solidifies imagewise. This coating is most conveniently done if the composition is a liquid at room temperature, but a solid composition may also be melted to form a layer, or a solid or paste composition may be coated if it shows shear thinning behavior. Subsequently, new thin layers of photoformable composition are coated onto previous layers of exposed and unexposed composition. Then the new layer is exposed imagewise in order to solidify portions imagewise and in order to induce adhesion between portions of the new hardened region and portions of the previously hardened region. Each imagewise exposure is of a shape that relates to a pertinent cross-section of a photohardened object such that when all the layers have been coated and all the exposures have been completed, an integral photohardened object can be removed from the surrounding composition.

Accordingly, a rapid prototyping process can for instance be described as:

(1) coating a thin layer of a composition onto a surface;
(2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article.

In general, the three-dimensional article formed by exposure to actinic radiation, as discussed above, is not fully cured, by which is meant that not all of the reactive material in the composition has reacted. Therefore, there is often an additional step of more fully curing the article. This can be accomplished by further irradiating with actinic radiation, heating, or both. Exposure to actinic radiation can be accomplished with any convenient radiation source, generally a UV light, for a time ranging from about 10 to over 60 minutes. Heating is generally carried out at a temperature in the range of about 75-150° C., for a time ranging from about 10 to over 60 minutes For the present invention postcuring is performed during 60 minutes exposure in a UV-postcure apparatus without additional heating, to obtain a fully cured article, unless otherwise specified (see examples 1-3)

$K_{1c}$ and Izod values.

The cured articles made from the resin composition of the present invention have—after full cure—high toughness in combination with a high E-modulus. Toughness can be determined by a number of different methods, of which the Izod (impact resistance) is the best known method. The cured articles according to the invention have an Izod of at least 0.45 J/cm, preferably at least 0.5 J/cm, more preferably at least 0.55 J/cm, more preferably at least 0.6 J/cm, even more preferably at least 0.8 J/cm.

An alternative measure for toughness is resistance against crack propagation, which can be determined by measuring the $K_{1c}$-value. The $K_{1c}$-value of cured articles described in the state of the art is always below 1 MPa·$(m)^{1/2}$, when an E-modulus of 2 GPa (2000 MPa) or larger is measured. The articles made from the resin compositions according to the invention have a $K_{1c}$-value of at least 1.3 MPa·$(m)^{1/2}$, preferably at least 1.6 MPa·$(m)^{1/2}$, more preferably at least 1.9 MPa·$(m)^{1/2}$, and most preferred at least 2.5 MPa·$(m)^{1/2}$.

EXAMPLES

TABLE 1

Materials List

| Material Name | Material Description | Vendor |
|---|---|---|
| Epon 825 | Bisphenol A Diglycidyl Ether Epoxy Resin | Resolution Performance Products |
| Cyracure UVR-6105 | 3,4-Epoxy Cyclohexyl Methyl-3,4-Epoxy Cyclohexyl Carboxylate | Dow Chemical |
| Ebecryl 3605 | Partially acrylated Bisphenol-A epoxy resin | UCB/Cytec |
| Oxetane OXT-101 | 3-ethyl-3-hydroxymethyl-oxetane | Toagosei |
| Vinylether ethyl acrylate | 2-(2-Vinyloxyethoxy)ethyl acrylate | Nippon Shokubai Co. Ltd. |
| Ebecryl 3700 | Bisphenol-A epoxy diacrylate | UCB/Cytec |
| SR-399 | Dipentaerythritol Pentaacrylate Esters | Sartomer |
| SR 349 | Bisphenol A Ethoxylate Diacrylate | Sartomer |
| SynFac 8025U | Polyalkoxylated Bisphenol A | Milliken Chemical |
| SynFac 8009 | Polyalkoxylated Bisphenol A | Milliken Chemical |
| Stepanpol PS2002 | Di[(diethylene glycol) o-phthalate] | Stepan Company |
| Emulgen BPA-5 | Polyalkoxylated Bisphenol A | Kao Specialties Americas |
| Bisphenol A (ethoxylate)4, EO(4)BPA | Polyalkoxylated Bisphenol A Average Mn = 404 g/mol | Aldrich |
| Triethylene Glycol | | Aldrich |
| Pluracol TP 440 | Propoxylated Trimethylolpropane | BASF |

TABLE 1-continued

Materials List

| Material Name | Material Description | Vendor |
|---|---|---|
| Terathane 1000 | Poly(tetramethylene ether) glycol | Invista |
| Placcel 220EB | Poly(hexamethylene carbonate) diol CAS#61630-98-6 Average Mn = 2000 g/mol | Daicel |
| Propylene Carbonate | | Aldrich |
| BYK A 501 | Antifoam solution, silicone free | BYK Chemie |
| Silwet L7600 | Polyalkyleneoxide modified polydimethylsiloxane | GE Silicones-OSI Specialties |
| Chivacure 1176 | Arylsulfonium Hexafluoroantimonate | Chitec |
| Rhodorsil 2074 | Aryliodonium tetrakis pentafluorophenyl borate | Rhodia |
| Chivacure BMS | 4-Benzoyl-4'-methyldiphenyl sulfide | Chitec |
| Irgacure 184 | 1-Hydroxycyclohexyl phenyl ketone | Ciba Additives |
| Paraloid EXL-2314 | Acrylic core-shell polymer | Rohm and Haas |
| Paraloid EXL-2600 | Acrylic core-shell polymer | Rohm and Haas |
| Durastrength D400 | Acrylic core-shell polymer | Arkema |
| SR-9003 | Propoxylated Neopentyl Glycol Diacrylate | Sartomer |
| Paraloid KM-365 | Acrylic core-shell polymer | Rohm and Haas |
| Albidur EP 2240 | Polysiloxane particles in epoxy | Hanse Chemie |
| Terathane 250 | poly(tetramethylene ether) glycol | Invista |
| DPHA | Dipentaerythritol hexacrylate ester | Sartomer |

Preparation of Epoxy Formulations: (Table 4), Examples 1-3

A mixture of the epoxy and the polyol components was heated to approximately 60° C. and stirred with a magnetic stirrer for 5 minutes. In the next step, the impact modifier was slowly added to the formulation while continuing stirring. After completion of this addition, the formulation was heated to 100° C. and continuously stirred overnight to obtain a good dispersion. Treating the mixture with an Ultra-Turrax T25 dispersing instrument further optimized the dispersion quality. Three pulses of 20 seconds were applied. After this treatment the liquid resin was cooled to 70° C. after which the photo initiator was added and the complete formulation was stirred with a magnetic stirrer for 5 minutes. Finally, the liquid resin was cooled to room temperature.

Bulk Molding: Examples 1-3

Thick parts (tensile and $K_{1c}$ fracture toughness bars) were prepared by bulk molding, using a rubber mold with pre-defined sample shapes. Strips with dimensions 60*10*4 mm and 150*30*4 mm (L*W*T) were prepared from which $K_{1c}$ and tensile bars, respectively, were machined.

In order to prepare thick parts the liquid resin formulation was poured into the mold in four subsequent fillings, each with a layer thickness of about 1 mm, with intermediate UV-curing. Curing was applied by passing the mold at room temperature, in open air, three times through a home built UV-rig equipped with a 400 Watt medium pressure Hg bulb. An integral UV dose of 6 J/cm² was applied to each layer. The dose was measured with an International Light IL390 Light Bug.

Post Baking: Examples 1-3

Post cure was performed by storing the samples for approximately 20 h at 80° C. in a hot air oven. After post cure the samples were stored for at least a week at room temperature (23° C.) and 50% relative humidity before the testing was performed. $K_{1c}$ and tensile testing of these samples was performed under the same environmental conditions.

Preparation of Hybrid Formulations—Examples 4-10, Comparative Experiments A-D

Preparation of Dispersions (Table 4 and Table 5a, 5b and 5c)

Core-shell powders were added to epoxy resin with gentle stirring and mixed until the powders were wetted. The slurry was transferred to the mix can of a three-shaft Versamixer manufactured by Charles Ross & Sons. The slurry was mixed at 60 rpm with the anchor mixer, while the water jacket was heated with hot water. When the slurry temperature reached 35° C., the disperser speed was set to 5000 rpm and the water flow to the water jacket was stopped. When the slurry temperature rose to 45° C., the disperser speed was raised to 6500 rpm and the emulsifier speed was set at 5500 rpm. The mix can was evacuated to a vacuum of 948 mbar once the temperature reached 60° C. When the temperature reached 80-82° C., the disperser and emulsifier were turned off and the mixture was cooled by flowing cold water through the water-jacket. Once the temperature fell below 50° C., the anchor agitator was turned off and air was re-admitted to the mix can.

TABLE 2

Examples of Core-Shell Dispersions

| | D1 | D2 | D3 | D4 | D5 | D6 |
|---|---|---|---|---|---|---|
| UVR 6105 (%) | 62.7 | 80 | 80 | | | 52.6 |
| Epon 825 (%) | 20.2 | | | 80 | 80 | 27.4 |
| EXL-2314 (%) | 17.1 | 20 | 20 | 20 | 20 | |
| KM-365 (%) | | | | | | 20 |
| Used in Example/comparative experiment | 9 | 4, 7, B, C | 5, 7, 8 | 5, 7, 8 | 4, 7, B, C | 10 |

Preparation of Formulations

The individual components were weighed out and added into a suitable container. Several components (the core-shell/epoxy dispersions, Ebecryl 3605, and Stepanpol) were warmed to 55° before being weighed out and blended. Mixing was accomplished over 6-16 hours at ambient temperature using a propeller type mixing blade. Formulations were degassed by immersion in an ultrasonic bath at 30-40° C. The compositions of the Example and Comparative Experiment formulations are listed in Tables 5 and 6.

Working Curve Measurement

The exposure response for each formulation was measured using a 20 g sample of the formulation in a 100 mm diameter Petri dish held at 30° C. and 30% RH. The surface of the formulation was exposed with a beam from a laser; either an argon-ion laser operating with the wavelengths of 333, 351, and 364 nm or a solid state laser operating at a wavelength of 354 nm can be used. The exposures were made in half-inch squares which were scanned out by drawing consecutive parallel lines approximately 50.8 micron apart on the surface of the liquid in the petri-dish. The spot diameter at the liquid surface was approximately 0.0127 cm in diameter ($1/e^2$). After waiting at least 15 minutes for the exposed panels to harden, the panels were removed from the Petri dish and excess, uncured resin was removed by blotting with a Kimwipe EX-L (Kimberly Clark). Film thickness was measured with a Mitutoyo Model ID-C112CE Indicator Micrometer. Film thickness is a linear function of the logarithm of the exposure energy; the slope of the regression is Dp (units of micron) and the intercept is Ec (units of mJ/cm2)

Building Parts

Test formulations were selectively irradiated by a scanned laser beam to form the desired cross-section layer using a Somos Solid State Imager (SSI) or 3D Systems SLA-250 stereolithography machine. The exposure energy was determined by the laser power, the scanning speed, the laser pulse frequency and the scan line spacing. The exposure energy was adjusted to yield a target cured layer thickness (cure depth) based on the Ec and Dp values determined for the resin. The exposed layer was submerged under a layer of unpolymerized resin and the exposure step was repeated. These exposure and recoat steps were repeated until cured parts were obtained with the desired part thickness. Tables 5 and 6 list the laser wavelength, coated layer thickness and calculated depth of cure for the mechanical test parts that were made. Completed parts were lifted out of the formulation vat and removed from their build platform. Uncured resin that was adhered to the parts was washed away with TPM (tripropylene glycol mono methyl ether). The parts were rinsed with isopropanol and dried. Parts were then placed in a post-curing apparatus ("PCA" sold by 3-D Systems, 10 bulb unit using Phillips ILK/05 40 W bulbs) and exposed to 60 minutes of UV radiation at room temperature.
Tensile Testing Dog-bone shaped tensile test specimens were built by multiple layer exposure. The samples were nominally 150 mm long, 10.15 mm wide in their narrow region and 3.8 mm thick. At least three specimens were built from each formulation. Specimens were cleaned, dried and subjected to UV postcure as described above. Specimens were placed in an environment controlled at 50% RH and 20-23° C. for seven days. Specimens were removed from the controlled environment immediately prior to testing. Width and thickness of each specimen were measured with a caliper. Specimens were tested using an MTS Sintech tensile tester following the procedure of ASTM D638. Samples were held in a set of wedge action grips with serrated faces; grip separation was 105 mm. Stress was measured with a 28.913 kN load cell and strain was measured with an extensometer set to initial gauge length of 25.4 mm. Stress and strain were recorded at a grip separation speed of 5.08 mm/minute. Young's Modulus, % Elongation at Yield, Yield Stress, % Elongation at Break and Break Stress were recorded for each specimen. The average for the three specimens is reported in Tables 5 and 6. The Young's modulus was taken from the slope of the stress-strain curve between 0.05 and 0.25% elongation. The Yield Stress was taken from the maximum in the stress-strain curve (i.e. the Yield point), which usually is found between 2 and 8% elongation. If the sample fails at an elongation between 0 and 10%, without showing a maximum in the stress-strain curve, the maximum stress is taken as approximation for the Yield Stress. The % Elongation at Yield is the strain at the yield point. % Elongation at Break and the Break Stress are taken from the last data point before failure of the sample.

Determination of the Critical Stress Intensity Factor $K_{1c}$

The fracture toughness measurements were performed using the Linear Elastic Fracture Mechanics (LEFM) standard for determining $K_c$ and $G_c$ for plastics, as drafted by the European Group of Fracture (EGF, nowadays called ESIS): J. G. Williams, ESIS: Testing protocol, October 1989; A linear elastic fracture mechanics (LEFM) standard for determining $K_c$ and $G_c$ for plastics.

The $K_c$ is the critical stress intensity factor at crack propagation. When measured in tensile mode (called mode-1), this toughness parameters is denoted as $K_{1c}$. The measurements were performed using Single Edge Notch Bend (SENB) specimen. The geometry of the SENB specimen as used is shown in FIG. 1.

Figure 1:
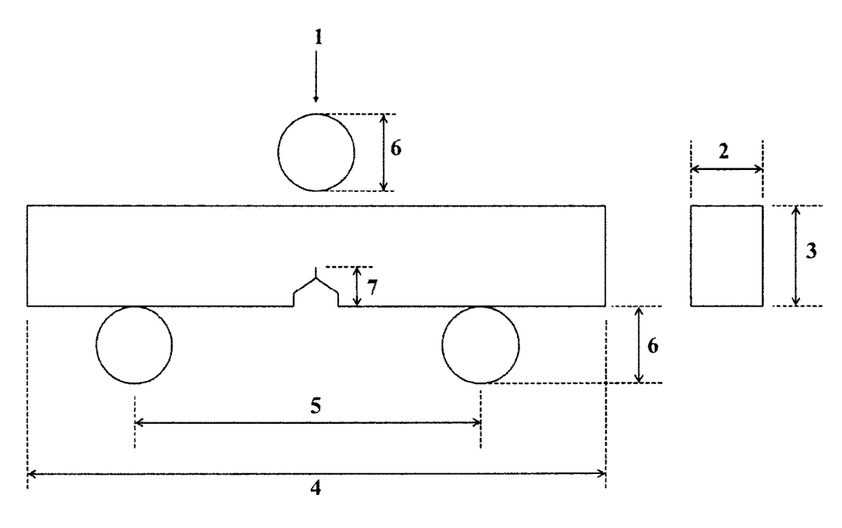
FIG. 1 depicts the geometry of the Single Edge Notch Bend (SENB) specimen used to determine the critical stress intensity factor $K_{1C}$ values identified in the Examples section herein, infra.

Turning to FIG. 1, a load 1 having load diameter 6 (also referred to as "D" in Table 3 below) is applied to the sample, which further possesses a sample thickness 2 (referred to as "B" in Table 3), ligament width 3 ("W" in Table 3), and sample length 4 ("L" in Table 3). The sample is supported by supports as shown having a support length 5 ("S" in Table 3) and support diameter 6 ("D" in Table 3). The sample further possesses a cut notch with cut notch length 7 ("a" in Table 3).

Since $K_{1c}$ is a parameter measuring the resistance of a material against crack propagation, it is necessary to pre-crack the specimen. The pre-crack should preferably be straight and sharp. An insufficient sharp pre-crack notch will result in too high $K_{1c}$ values. For the SENB samples the machined notch was further sharpened by tapping a razor blade into the notch. Normally, a sharp pre-crack notch is generated, as the pre-crack length is at least a few millimeters ahead of the razor blade tip.

Care was taken that the sample dimensions comply with the ESIS requirements as specified in Table 3.

TABLE 3

Geometry requirements for the samples according to ESIS.

| Description | ESIS geometry requirements |
|---|---|
| Sample thickness, B | B |
| Ligament width, W | 4B > W > 2B |
| Sample length, L | L ≥ 4.4W |
| Support&load diameter, D | W/4 < D < W |
| Support length, S | S = 4W |
| Cut notch length, a | a/W = 0.3 |
| Pre-cracked notch length | a/W = 0.4-0.6 |

In practice the sample thickness B, width W and length L may vary from sample to sample, under the constraint that the ESIS geometry requirements are met. For the materials of this invention, the preferred range for B is from 2.5-15 mm, while for W a range from 8-30 mm is preferred. For samples with $K_{1C}$ of more than 3.5 MPa*√m larger dimensions may be required. The sample length is preferably 4.5-6 times the sample width W. The support length S is adjusted at the beginning of the test to exactly 4 times the sample width W. A notch with length a, equal to 0.3 times the sample width W, is made with a standard saw, after which the pre-cracked notch is prepared with a razor blade as described before The measurements were performed using a Zwick Z1455 tensile test machine, controlled with Zwick TestXpert software (version 5.43). The force was recorded using a 2 kN force transducer. A displacement transducer (Zwick long stroke extensometer with a resolution of 0.0025 mm/step) was used for measuring the mid-deflection of the beam. The standard 3-point bending tools were used to support and to load the samples in the machine. The applied test speed was 1 mm/min. The support & load diameter was fixed to 6 mm.

Calculation of the Stress Intensity Factor $K_{1Q}$

The stress intensity factor ($K_{1Q}$) was calculated using the equations from the ESIS testing protocol for the SENB test piece:

$$K_{1Q} = f*(F/B)*\sqrt{W}$$

in which:

$$f = 6*\sqrt{(a/W)}*(1.99 - a/W(1-a/W)*(2.15 - 3.93*a/W + 27*(a/W)^2)/(1+2*a/W)(1-a/W)^{3/2}$$

With:
f: calibration/geometry factor, depending on the a/W ratio
F: maximum force at the start of crack propagation.
B: thickness of the sample
W: ligament width of the sample
Validity of the Test and Determination of the Critical Stress Intensity Factor $K_{1c}$ For a valid determination of the critical value of the stress intensity factor $K_{1Q}$, i.e. the critical stress intensity factor $K_{1c}$, it is required that the test specimen dimensions are larger than the plastic zone size, so that any effect of the plastic zone dimensions on the stress intensity analysis can be neglected and a predominantly plane strain state is obtained. This is ensured if the following size criteria are met:

$$B, a, (W-a) > 2.5 (K_{1Q}/\sigma_y)_2$$

in which $\sigma_y$ is the yield stress of the material as determined with the tensile test as describe before. When these conditions are met, the specimen thickness B is sufficient to ensure plain strain, while the width W is sufficient to avoid excessive plasticity in the ligament.

Typically, the test is performed on 3-5 specimens with equal dimensions. The average value of the results from these tests is reported.

Izod Value

Izod impact testing provides an assessment of the ability of materials to withstand rapidly applied forces such as are encountered from falling objects, collisions, drops, etc. The test does not provide engineering data about a given material, rather it is best used to compare the impact resistance of materials formed into a specified specimen shape and tested under identical conditions.

When comparing the impact resistance of plastic materials, the notched Izod test, as described in ASTM D 256 is widely used. In this test, specimens are fabricated to a defined geometry and a notch is machined into one face of the specimen. The notch simulates the presence in a part of sharp corners, intersecting faces or machined features (such as tapped screw holes).

For the notched Izod test, the specimen is held vertically in a vise with the notch parallel to the top of the vise. A pendulum mounted hammer with a defined striking edge is released from a defined height and swings into the notched face of the specimen at a specified distance above the notch. The height attained by the hammer after shearing the specimen corresponds to the residual energy of the hammer. The hammer energy lost to the specimen accounts for the energy to make a crack at the notch tip, to propagate the crack and to propel the broken piece of the specimen away from the impact area. The impact energy is determined as the energy lost by the hammer minus the energy required to propel the broken piece from the specimen. Results from different materials should be compared only when the geometry, notching technique, notch radius and testing conditions (equipment, temperature, etc.) are held constant.

Izod Impact Testing

Test specimens were built by multiple layer exposure. The samples were nominally 63.5 mm long, 12.7 mm wide and 6.35 mm thick in conformity with ASTM D-256A. At least five specimens were built from each formulation. Specimens were cleaned, dried and subjected to UV postcure as described above. Specimens were left at ambient conditions for two days before notching. Specimens were notched according to ASTM D-256A using a CS-93M Sample Notcher from CSI. The notched samples were placed in an environment controlled at 50% RH and 20-23° C. for two days. Specimens were removed from the controlled environment immediately prior to testing. Izod Impact values were measured with a Zwick model 5110 impact tester fitted with a 2.75 J pendulum.

Determination of the Dynamic Storage Modulus E' at 200° C.

The dynamic storage modulus of the material of the present invention is measured by DMTA in tension according to ASTM D5026-95a "Standard Test Method for Measuring the Dynamic Mechanical Properties of Plastics in Tension", under the following conditions, which are adapted for the coatings of the present invention.

A temperature sweep measurement is carried out under the following test conditions:

| | |
|---|---|
| Test pieces: | Rectangular strips |
| Length between grips: | 18-22 mm |
| Width: | 4 mm |
| Thickness: | between about 50 and 1000 µm |
| Equipment: | Tests were performed on a DMTA machine from TA instruments type RSA3 |
| Frequency: | 1 Hz |
| Initial strain: | 0.15% |
| Temperature range: | starting from −130° C. heating until 250° C. |
| Ramp speed: | 5° C./min |
| Autotension: | Static Force Tracking Dynamic Force |
| | Initial static Force: 0.9N |
| | Static > Dynamic Force 10% |
| Autostrain: | Max. Applied Strain: 2% |
| | Min. Allowed Force: 0.05N |
| | Max. Allowed Force: 1.4N |
| | Strain adjustment: 10% (of current strain) |
| Dimensions test piece: | Thickness: measured with an electronic Heidenhain thickness measuring device type MT 30B with a resolution of 1 µm. |
| | Width: measured with a MITUTOYO microscope with a resolution of 1 µm. |

All the equipment was calibrated in accordance with ISO 9001. Before starting the measurement each rectangular strip was dried for 5 minutes at room temperature in a nitrogen atmosphere In a DMTA measurement, which is a dynamic measurement, the following moduli are measured: the storage modulus E', the loss modulus E", and the dynamic modulus E* according to the following relation $E^* = (E'^2 + E''^2)^{1/2}$.

The value of the storage modulus E' in the DMTA curve at a temperature of 200° C., measured at a frequency of 1 Hz under the conditions as described in detail above, is taken.

TABLE 4

Examples of epoxy formulations

| | Example | | |
|---|---|---|---|
| | 1 | 2 | 3 |
| EPON 825 (%) | 58.8 | 58.8 | 58.8 |
| Emulgen (%) | 31.7 | 31.7 | 31.7 |
| EXL2600 (%) | 9.0 | | |
| EXL2314 (%) | | 9.0 | |
| Albidur EP 2240 (%) | | | 9.0* |
| Chivacure (%) | 0.5 | 0.5 | 0.5 |
| Cat. Poly./Hydroxy | 2.34 | 2.34 | 2.34 |
| Content aromatic and cycloaliphatic | 0.36 | 0.36 | 0.36 |

TABLE 4-continued

Examples of epoxy formulations

|  | Example | | |
|---|---|---|---|
|  | 1 | 2 | 3 |
| E [GPa] | 2.2 | 2.3 | 2.2 |
| Yield [MPa] | 44 | 47 | 41 |
| $K_{1Q}$ (MPa * $m^{1/2}$) | 1.43 | 2.55 | 1.44 |
| Specimen width W (mm) | 8.9 | 8.9 | 8.9 |
| Specimen thickness B (mm) | 3.34 | 2.99 | 2.79 |
| $K_{1c}$ [MPa * $m^{1/2}$] | 1.43 | >1.63** | >1.37** |

*Denotes weight % of polysiloxane particles from the Albidur EP 2240. The epoxy portion of the Albidur is included in the weight % Epon 825.
**Specimen thickness for examples 2 and 3 is less than the lower limit for a valid $K_{1c}$ determination. Consequently, the critical value is expected to be lower than the value of $K_{1Q}$. For $K_{1c}$ we therefore specify the maximum valid value that can be determined with this sample thickness, given the level of the yield stress of the material. This value serves as a lower limit for the $K_{1c}$ of the material.

TABLE 5a

Examples of hybrid formulations

|  | Example | | | | | | |
|---|---|---|---|---|---|---|---|
|  | 4 | 5 | 6 | 7 | 8 | 9 | 10 |
| UVR 6105 (%) | 40.87 | 30.70 | 40.87 | 31.69 | 20.00 | 37.81 | 30.70 |
| Epon 825 (%) | 10.22 | 16.00 | 20.44 | 18.39 | 29.00 | 12.17 | 16.01 |
| Chivacure 1176 (%) | 2.26 | 3.32 | 2.26 | 2.26 | 3.30 | 3.29 | 3.30 |
| SynFac 8025U (%) | 15.33 | 13.00 | 15.33 | 9.50 | 6.70 | 8.44 | 13.00 |
| Stepanpol PS2002 (%) | 10.22 | 5.40 |  | 6.34 | 10.00 | 4.15 | 5.40 |
| Triethyleneglycol (%) | 4.34 | 4.25 | 4.34 | 4.34 | 4.25 | 4.22 | 4.25 |
| EXL-2314 (%) | 5.11 | 9.00 | 5.11 | 7.15 | 8.00 | 10.34 |  |
| KM-365 (%) |  |  |  |  |  |  | 9.00 |
| SR399 (%) | 4.34 | 4.25 | 4.34 | 4.34 | 4.25 | 4.13 | 4.25 |
| SR-9003 (%) |  |  |  |  |  | 2.00 |  |
| Irgacure 184 (%) | 1.99 | 2.30 | 1.99 | 1.99 | 2.30 | 2.26 | 2.30 |
| Ebecryl 3605 (%) | 5.11 | 11.6 | 5.11 | 13.80 | 12.00 | 10.98 | 11.60 |
| Silwet 7600 (%) | 0.13 | 0.13 | 0.13 | 0.13 | 0.13 | 0.13 | 0.13 |
| BYK 501 (%) | 0.07 | 0.07 | 0.07 | 0.07 | 0.07 | 0.07 | 0.07 |
| Cat. Poly./Hydroxy | 2.82 | 3.14 | 4.35 | 3.56 | 3.13 | 4.10 | 3.15 |
| Cat. Poly./Rad. Poly. | 7.46 | 5.43 | 8.55 | 5.36 | 5.19 | 6.17 | 5.43 |
| Content Aromatic &Cycloaliphatic | 0.38 | 0.35 | 0.40 | 0.36 | 0.33 | 0.36 | 0.35 |
| Build Information |  |  |  |  |  |  |  |
| Machine | SSI | SLA 250 | SSI | SSI | SSI | SSI | SSI |
| Laser Type/Wavelength (nm) | Ar+/351 | Solid State/354.7 | Solid State/354.7 | Ar+/351 | Solid State/354.7 | Solid State/354.7 | Solid State/354.7 |
| Cure Depth (μm) | 304.8 | 254 | 304.8 | 304.8 | 254 | 304.8 | 254 |
| Layer Thickness (μm) | 152.4 | 101.6 | 152.4 | 152.4 | 127 | 152.4 | 127 |
| Modulus (MPa) | 2200 | 2549 | 2900 | 2700 | 2200 | 2170 | 2000 |
| Yld Stress (MPa) | 35 | 48 | 56 | 50 | 41 | 41 | 34 |
| Elongation at Break % | 14 | 12.6 | 7 | 9.4 | 24 | 32 | 25 |
| Izod (J/cm) | 0.59 | 0.54 | 0.47 | 0.48 | 0.51 | 0.49 | 0.94 |
| $K_{1Q}$ (MPa*$m^{1/2}$) |  | 2.9 |  | 2.3 |  | 3.3 |  |
| Specimen width W (mm) |  | 21.3 |  | 12.2 |  | 12.2 |  |
| Specimen thickness B (mm) |  | 10.4 |  | 5.87 |  | 5.94 |  |
| $K_{1c}$ (MPa*$m^{1/2}$) |  | 2.9 |  | 2.3 |  | >2.0* |  |

*Specimen thickness for example 9 is less than the lower limit for a valid $K_{1c}$ determination. Consequently, the critical value is expected to be lower than the value of $K_{1Q}$. For $K_{1c}$ we therefore specify the maximum valid value that can be determined with this sample thickness, given the level of the yield stress of the material. This value serves as a lower limit for the $K_{1C}$ of the material TABLE 5b Examples of hybrid formulations

|  | Example | | | | |
|---|---|---|---|---|---|
|  | 11 | 12 | 13 | 14 | 15 |
| UVR 6105 (%) | 30.7 | 27.2 | 30.7 | 30.8 | 30.7 |
| Epon 825 (%) | 16 | 16 | 21 | 16.05 | 15 |
| Oxetane OXT 101 (%) |  | 3 |  |  |  |
| Vinylether ethyl acrylate (%) |  |  | 5.2 |  |  |
| Chivacure 1176 (%) | 3.3 | 3.3 | 3.3 |  | 3.3 |
| Rhodorsil 2074 (%) |  |  |  | 1.0 |  |
| Chivacure BMS (%) |  |  |  | 0.33 |  |
| Propylene carbonate (%) |  |  |  | 1.66 |  |
| SynFac 8025U (%) | 13 | 13 | 13 |  | 11.5 |

TABLE 5b-continued

Examples of hybrid formulations

| | Example | | | | |
|---|---|---|---|---|---|
| | 11 | 12 | 13 | 14 | 15 |
| Synfac 8009 (%) | 13 | | | | |
| Stepanpol PS2002 (%) | 5.4 | 5.4 | 6 | 5.42 | 5.1 |
| Triethyleneglycol (%) | 4.25 | 4.25 | 4.85 | 4.26 | |
| Propoxylated trimethylolpropane Pluracol TP440 (%) | | | | | 7.55 |
| EXL-2314 (%) | 9 | 9 | 9 | 9 | 9 |
| SR399 (%) | 4.25 | 4.25 | 4.5 | 4.26 | 4.25 |
| Irgacure 184 (%) | 2.30 | 2.30 | 2.30 | 2.31 | 2.30 |
| Ebecryl 3605 (%) | 11.6 | 11.6 | | 11.64 | 11.1 |
| Silwet L7600 (%) | 0.13 | 0.13 | 0.13 | 0.13 | 0.13 |
| BYK A501 (%) | 0.07 | 0.07 | 0.07 | 0.07 | 0.07 |
| Cat. Poly./Hydroxy | 2.8 | 2.4 | 3.2 | 3.1 | 3.2 |
| Cat. Poly./Rad. Poly. | 5.43 | 5.46 | 5.65 | 5.43 | 5.42 |
| Content Aromatic &Cycloaliphatic | 0.36 | 0.33 | 0.33 | 0.35 | 0.34 |
| Build Information | | | | | |
| Machine | SSI | SSI | SSI | SSI | SSI |
| Laser Type/Wavelength (nm) | Solid State/354.7 | Solid State/354.7 | Solid State/354.7 | Solid State/354.7 | Solid State/354.7 |
| Cure Depth (μm) | 254 | 254 | 254 | 254 | 254 |
| Layer Thickness (μm) | 127 | 127 | 127 | 127 | 127 |
| Modulus (MPa) | 2596 | 2498 | 2071 | 2353 | 2787 |
| Yld Stress (MPa) | 38 | 45 | 34 | 41 | 47 |
| Elongation at break (%) | 10.7 | 31 | 48 | 34 | 12 |
| Izod (J/cm) | 0.56 | 0.79 | 0.84 | 0.55 | 0.50 |
| $K_{1Q}$ (MPa*m$^{1/2}$) | | | | | |
| Specimen width W (mm) | | | | | |
| Specimen thickness B (mm) | | | | | |
| $K_{1c}$ (MPa*m$^{1/2}$) | | | | | |

TABLE 5c

Examples of hybrid formulations

| | Example | | |
|---|---|---|---|
| | 16 | 17 | 18 |
| UVR 6105 (%) | 27.05 | 22.1 | 35 |
| Epon 825 (%) | 18.56 | 22.1 | 18 |
| Oxetane OXT 101 (%) | 2.25 | | |
| Chivacure 1176 (%) | 3.37 | 3.5 | 3.5 |
| SR 349 (%); BPA(EO)3DA | 1.17 | 9.7 | 11.9 |
| Placcel 220EB (%) | 4.25 | 13.5 | 10 |
| BPA (EO)4 (%) | 4.69 | 22 | |
| SynFac 8025U (%) | 9.75 | | 10.7 |
| Stepanpol PS2002 (%) | 4.05 | | |
| Triethyleneglycol (%) | 3.19 | | 3.9 |
| EXL-2314 (%) | 6.75 | | |
| SR399 (%) | 3.77 | 4.6 | 4.4 |
| Irgacure 184 (%) | 2.32 | 2.3 | 2.4 |
| Ebecryl 3605 (%) | 8.7 | | |
| Silwet L7600 (%) | 0.1 | 0.13 | 0.13 |
| BYK A501 (%) | 0.05 | 0.07 | 0.07 |
| Cat. Poly./Hydroxy | 2.7 | 2.4 | 4 |
| Cat. Poly./Rad. Poly. | 5.95 | 5.1 | 5.6 |
| Content Aromatic &Cycloaliphatic | 0.34 | 0.35 | 0.37 |
| Build Information | | | |
| Machine | SSI | 3D-systems Viper | 3D-systems Viper |
| Laser Type/Wavelength (nm) | Solid State/354.7 | Solid State/354.7 | Solid State/354.7 |
| Cure Depth (μm) | 254 | 254 | 254 |
| Layer Thickness (μm) | 127 | 152.4 | 152.4 |
| Modulus (MPa) | 2041 | 2030 | 2300 |
| Yld Stress (MPa) | 41.2 | 43.7 | 56.0 |
| Elongation at break (%) | 16.2 | 18.3 | 13.0 |
| Izod (J/cm) | 0.66 | 0.45 | 0.45 |
| $K_{1Q}$ (MPa*m$^{1/2}$) | | 3.0 | 1.9 |

TABLE 5c-continued

Examples of hybrid formulations

| | Example | | |
|---|---|---|---|
| | 16 | 17 | 18 |
| Specimen width W (mm) | | 21.3 | 21.3 |
| Specimen thickness B (mm) | | 10.7 | 10.2 |
| $K_{1c}$ (MPa*m$^{1/2}$) | | >2.85 | 1.9 |

Examples 17 and 18 have been postbaked at 80 C during 24 hours after the UV postcure.

TABLE 6a

Comparative Experiments: hybrid formulations

| | Comparative experiments | | | |
|---|---|---|---|---|
| | A | B | C | D |
| Epon 825 (%) | 14.25 | 20.44 | 14.70 | 1.80 |
| UVR 6105 (%) | 44.26 | 40.87 | 43.29 | 56.90 |
| Chivacure 1176 (%) | 3.85 | 2.26 | 3.67 | 4.94 |
| Stepanpol PS2002 (%) | 4.85 | 0.00 | 4.62 | |
| SynFac 8025U (%) | 4.94 | 5.11 | 9.42 | |
| Terathane 1000 (%) | | | | 14.97 |
| Triethyleneglycol (%) | 4.94 | 4.34 | 4.71 | |
| EXL-2314 (%) | | 5.11 | | |
| Albidur EP 2240 (%) | | | | 1.20* |
| SR399 (%) | 4.84 | 4.34 | 4.61 | |
| SR-9003 (%) | 2.34 | | | |
| Ebecryl 3700 (%) | | | | 17.97 |
| Ebecryl 3605 (%) | 12.85 | 15.33 | 12.24 | |
| Irgacure 184 (%) | 2.65 | 1.99 | 2.53 | 2.00 |
| BYK 501 (%) | 0.08 | 0.07 | 0.07 | 0.02 |
| Silwet 7600 (%) | 0.16 | 0.13 | 0.15 | 0.20 |

TABLE 6a-continued

Comparative Experiments: hybrid formulations

| | Comparative experiments | | | |
|---|---|---|---|---|
| | A | B | C | D |
| Cat. Poly./Hydroxy | 4.72 | 6.47 | 4.23 | 15.42 |
| Cat. Poly./Rad. Poly. | 6.16 | 6.28 | 6.38 | 6.73 |
| Content Aromatic &Cycloaliphatic | 0.41 | 0.41 | 0.41 | 0.37 |
| Build Information | | | | |
| Machine | SSI | SSI | SSI | SSI |
| Laser Type/wavelength | Solid State/354.7 | Ar+/351 | Solid State/354.7 | Solid State/354.7 |
| Cure Depth (μm) | 304.8 | 304.8 | 304.8 | 330.2 |
| Layer Thickness (μm) | 152.4 | 152.4 | 152.4 | 152.4 |
| RT, 7 days | | | | |
| Modulus (MPa) | 3526 | 3045 | 3087 | 2604 |
| Yld Stress (MPa) | 69 | 58 | 58 | 54 |
| Elongation at Break % | 5.7 | 4.1 | 11.2 | 7.6 |
| Izod Impact (J/cm) | 0.175 | 0.225 | 0.21 | 0.24 |
| | no impact modifier | Cat. Poly/Hydroxy high | no impact modifier | Cat. Poly/Hydroxy high |

TABLE 6b

Comparative Experiments: hybrid formulations

| | Comparative experiments | | |
|---|---|---|---|
| | E | F | G |
| Prior art document | EP938026 | EP938026 | EP938026 |
| Example in document | 1 | 7 | 8 |
| UVR 6110 (%) | 30 | 27 | |
| UVR 6199 (%) | 5 | 25 | 28 |
| Epolite 1600 (%) | 3 | | |
| TMPTA (%) | 25 | 13 | 25 |
| Sunnix GP-400 (%) | 15 | 13 | 12 |
| RKB rubber particles | 16 | 8 | 15 |
| Epolite 1500 NP (%) | | 10 | 16 |
| Photoinitiators | 6 | 4 | 4 |
| Cat. Poly./Hydroxy | 2.4 | 4.3 | 3.2 |
| Cat. Poly./Rad. Poly. | 1.1 | 3.2 | 1.1 |
| Content Aromatic &Cycloaliphatic | 0.19 | 0.25 | 0.11 |
| Properties | | | |
| Modulus (MPa) | 1580 | 1800 | 1420 |
| Izod Impact (J/cm) | 0.52 | 0.48 | 0.52 |
| Remarks | Modulus too low | Modulus too low | Modulus too low |
| Cause | Arom/cycl content low | Cat. Poly./Rad. Poly low | Arom/cycl content low |

TABLE 6c

Comparative Experiments: hybrid formulations

| | Comparative experiments | |
|---|---|---|
| | H | I |
| Prior art document | US2004013977 | US2004013977 |
| Example in prior art | 2 | 7 |
| UVR 6110 (%) | 47.6 | 56.9 |
| Araldyte DY-T (%) | 20 | 15 |
| Sumisol BPRE (%) | 10 | 10 |
| TMP (%) | 2 | 2 |
| Ebecryl 3700 (%) | 16.5 | 13.5 |
| Photoinitiators | 3.5 | 2.6 |

TABLE 6c-continued

Comparative Experiments: hybrid formulations

| | Comparative experiments | |
|---|---|---|
| | H | I |
| Additives | 0.4 | |
| Cat. Poly./Hydroxy | 7.1 | 7.5 |
| Cat. Poly./Rad. Poly. | 8.1 | 10.4 |
| Content Aromatic &Cycloaliphatic | 0.35 | 0.39 |
| Properties | | |
| Modulus (MPa) | 1900 | 1600-2100 |
| Izod Impact (J/cm) | 0.4 | 0.42 |
| Remarks | Modulus and impact too low | Impact too low |
| Cause | Cat. Poly/Hydroxy high + no impact modifier d | Cat. Poly/Hydroxy high + no impact modifier d |

PI's additives and rubber particles not included in calculation of Cat Poly/Hydroxy ratio, Cat. Poly./Rad. Poly. ratio and Content Aromatic & Cycloaliphatic groups.

Tables 6b and 6c show resin compositions as disclosed in prior art documents that however do not generate articles that show the desired properties as disclosed in the present invention.

The invention claimed is:

1. A radiation curable resin composition for the production of three-dimensional shaped articles by means of layerwise imaging methods comprising
    a) a cationically polymerizable component comprising at least one epoxy group,
    b) a cationic photoinitiator,
    c) a hydroxy functional component,
    d) an impact modifier that is a miscible compound that demixes into rubbery domains upon curing,
    e) a radically polymerizable compound, and
    f) a free radical photoinitiator,
    wherein the impact modifier that is a miscible compound that demixes into rubbery domains upon curing possesses a molecular weight of greater than 1500 g/mol and contains at least one elastomeric block with a Tg below 0° C.,
    wherein the resin composition after full cure has a tensile modulus of >2 GPa; a yield stress <70 MPa; and a $K_{1c}$ value >1.3 MPa·(m)$^{1/2}$ or an Izod value >0.45 J/cm, and
    wherein the cationically polymerizable/hydroxy ratio of the composition is in the range of from 2 to 5 and the cationically polymerizable/radically polymerizable ratio is in the range of from 4.5 to 15, wherein the cationically polymerizable/hydroxy ratio is the amount of cationically polymerizable functional groups divided by the amount of hydroxy functional groups present in the composition and the cationically polymerizable/radically polymerizable ratio is the amount of cationically polymerizable functional groups divided by the amount of radically polymerizable groups present in the composition.

2. The composition according to claim 1, wherein the hydroxy component contains at least one primary hydroxyl group.

3. The composition according to claim 1, wherein the hydroxy component contains at least two primary hydroxyl groups.

4. The composition according to claim 1, wherein the hydroxyl component is an alkoxylated aromatic diol or ethoxylated aromatic diol.

5. The composition according to claim 1, wherein the hydroxy component is selected from the group consisting of polyoxyethylene and polyoxypropylene glycols of molecular weights from about 200 to about 10,000; polytetramethylene glycols of varying molecular weight; poly(oxyethylene-oxybutylene) random or block copolymers; hydroxy-terminated polyesters and hydroxy-terminated polylactones; hydroxy-functionalized polyalkadienes, such as polybutadiene; aliphatic polycarbonate polyols, such as an aliphatic polycarbonate diol; hydroxy-terminated polyethers; and alkoxylated aromatic diols represented by the chemical structure shown:

wherein R3=—CH$_2$—, —C(CH$_3$)$_2$—, —C(CF$_3$)$_2$—, —CCl$_2$—, —O—, —S—, and R4=—CH$_2$CH$_2$— or —CH$_2$CH(CH$_3$)—, and n and m are 1 through 10.

6. The composition according to claim 1, wherein the hydroxyl component is an ethoxylated bisphenol A.

7. The composition according to claim 1, wherein the composition comprises 1-30 wt % of the impact modifier that is a miscible compound that demixes into rubbery domains upon curing.

8. The composition according to claim 7, wherein upon curing the rubbery domains of the impact modifier possess an average size of between 10 nm and 10 microns.

9. The composition according to claim 8, wherein the impact modifier that is a miscible compound that demixes into rubbery domains upon curing is an epoxy- or carboxy-terminated butadiene-nitrile rubber.

10. The composition according to claim 9, wherein the impact modifier that is a miscible compound that demixes into rubbery domains upon curing that is an epoxy- or carboxyterminated butadiene-nitrile rubber is also hydroxy-functional.

11. The composition according to claim 9, wherein the impact modifier that is a miscible compound that demixes into rubbery domains upon curing that is an epoxy- or carboxyterminated butadiene-nitrile rubber is not hydroxy-functional.

12. The composition according to claim 1, wherein the composition contains 1-30 wt % of radically polymerizable compound and 0.1-15 wt % of free radical photoinitiator.

13. The composition according to claim 12, wherein the radically polymerizable compound comprises a polyfunctional acrylate.

14. A radiation curable composition comprising
a) 5-90 wt % of an epoxy functional component,
b) 0.1-10 wt % of a cationic photoinitiator,
c) 1-35 wt % of a polyol,
d) 1-30 wt % of core shell particles that have reactive groups incorporated into the shell by copolymerization,
e) 1-35 wt % of a compound having at least one (meth)acrylate group,
f) 0.1-15 wt % of a radical photoinitiator,
g) 0-25 wt % of a compound having at least one radically curable group and one cationically curable group,
wherein the epoxy/hydroxy ratio of the composition is in the range from 2-5, the epoxy/(meth)acrylate ratio is in the range from 4.5-15 and the aromatic/cycloaliphatic content is between 0.2 and 0.6,
wherein the epoxy/hydroxy ratio is the amount of epoxy groups divided by the amount of hydroxy functional groups present in the composition and the epoxy/(meth)acrylate ratio is the amount of epoxy groups divided by the amount of (meth)acrylate groups present in the composition.

15. The radiation curable composition according to claim 14, wherein component (c) is selected from the group consisting of ethylene glycol, 1,2-propanediol, 1,3-propanediol, 1,3-butanediol, 1,4-butanediol, 1,5-pentanediol, 1,6-hexanediol, 1,7-heptanediol, 1,8-octanediol, 1,9-nonanediol, 1,10-decanediol, diethylene glycol, triethyleneglycol, tetraethylene glycol, dipropylene glycol, tripropylene glycol, polyoxyethylene and polyoxypropylene glycols of molecular weights from about 200 to about 1500 g/mol, polytetramethylene glycols, poly(oxyethylene-oxybutylene) random or block copolymers, hydroxy-terminated polyesters and hydroxy-terminated polylactones, hydroxy-functionalized polyalkadienes, aliphatic polycarbonate polyols, hydroxy-terminated polyethers, and alkoxylated aromatic diols.

16. The composition according to claim 1, wherein the composition comprises 1-15 wt % of a component having at least one epoxy group and at least one (meth)acrylate group.

17. The composition according to claim 1, wherein the composition comprises a aromatic/cycloaliphatic content between 0.2 and 0.6.

18. The composition according to claim 1, wherein the composition has a storage modulus from DMS at 200° C. and 1 Hz between 2 and 35 MPa.

19. The composition according to claim 1, wherein the composition contains a filler.

20. A process for making three dimensional articles comprising the steps of
(1) coating a thin layer of a composition onto a surface;
(2) exposing said thin layer imagewise to actinic radiation to form an imaged cross-section, wherein the radiation is of sufficient intensity and time to cause substantial curing of the thin layer in the exposed areas;
(3) coating a thin layer of the composition onto the previously exposed imaged cross-section;
(4) exposing said thin layer from step (3) imagewise to actinic radiation to form an additional imaged cross-section, wherein the radiation is of sufficient intensity and time to cause substantial curing of the thin layer in the exposed areas and to cause adhesion to the previously exposed imaged cross-section;
(5) repeating steps (3) and (4) a sufficient number of times in order to build up the three-dimensional article, wherein the composition is defined according to claim 1.

* * * * *